ADJUSTABLE GAIN NEGATIVE CONDUCTANCE AMPLIFIER

Filed Dec. 24, 1962

INVENTOR.
JOHN C. HOOVER
BY
John H. Gallagher
ATTORNEY

United States Patent Office 3,244,999

Patented Apr. 5, 1966

3,244,999

ADJUSTABLE GAIN NEGATIVE CONDUCTANCE AMPLIFIER

John C. Hoover, Clearwater, Fla., assignor to Sperry Rand Corporation, Great Neck, N.Y., a corporation of Delaware Filed Dec. 24, 1962, Ser. No. 246,823
13 Claims. (Cl. 330—61)

This invention relates to an adjustable gain amplifier employing a negative conductance device.

The realization of achieving negative conductance in semiconductor tunnel diodes has resulted in the ability to construct tunnel diode amplifiers that operate at high frequencies up to and including the microwave range of the frequency spectrum.

One known type of tunnel diode amplifier takes the form of a single port device comprised of a section of transmission line terminated at one end by a tunnel diode, and having an adjustable tuning stub positioned near the diode to tune out the capacitive susceptance associated with the diode. When this is accomplished, the diode appears as a substantially pure negative conductance, or resistance, that produces a certain value of reflection coefficient K at the other end of the transmission line, the reflection coefficient being equal to $$K=\frac{M-Y_t}{M+Y_t} \quad (1)$$

wherein M is the characteristic admittance of the line and $Y_t$ is the terminating admittance of the line, in this case the negative conductance of the diode terminating the end of the line. It is known that the voltage gain $g$ of the tunnel diode amplifier is equal to the voltage reflection coefficient K, so that the gain therefore is a function of the diode negative conductance.

Tunnel diode amplifiers offer the attraction that they are physically and electrically simple and are small in size, but they suffer the disadvantage that the negative conductance, or negative resistance, of the diodes cannot as yet be controlled to close limits in the manufacturing process. The change in voltage gain $\Delta g$ of said amplifiers is related to the change in negative resistance $\Delta R$ of the diodes by the quantity $g$, the voltage gain of the amplifier. Therefore, a small difference in negative resistances between different tunnel diodes will produce amplifiers having quite different gains. Tunnel diode amplifiers have potential use, for example, in multi-array antennas wherein an amplifier is associated with each one of a plurality of radiating means. In this arrangement, the gains of the amplifiers must be closely matched to each other to provide the desired radiating characteristics of the antenna. However, because of the inability to accurately control the negative conductance characteristics of the tunnel diodes during their manufacture, extreme care and considerable effort must be exercised in the manufacture and adjustment of these amplifiers. Furthermore, in the manufacture of a number of tunnel diode amplifiers intended to have identical charcteristics, extreme care must be exercised to select diodes having closely matched characteristics, and because present manufacturing procedures guarantee only that the rated value of negative conductance of a tunnel diode is accurate within a 20% range, this is not always an easy task. Furthermore, the replacement of a diode by the user of the amplifier to obtain the same gain as before may be even a more difficult task. These difficulties encoutnered in the operation of the tunnel diode amplifier result from the fact that to date tunnel diode amplifiers have had no means for easily adjusting or varying the gain of the amplifier, certainly no means that may be readily adjusted by the user of the amplifier without requiring a major effort. Quite often the adjustments must be performed as a factory service by the manufacturer.

It therefore is an object of this invention to provide a negative conductance amplifier that readily is tuned to provide a desired gain.

Another object of this invention is to provide an adjustable gain tunnel diode amplifier.

In accordance with the present invention a single port tunnel diode amplifier is comprised of a section of coaxial transmission line coupled at one end at a common junction with first and second coaxial line tuning stubs. The first stub is terminated by a tunnel diode to present a negative conductance termination, and the diode is movable with the stub so that the distance between the common junction and the diode varies as the stub is tuned. This causes a variation in the magnitude of the negative conductance that is presented at the junction, and since the gain of the amplifier is a function of the magnitude of the negative conductance at the junction, the gain varies with the change in position of the diode, thus providing adjustable tuning. The second stub is an adjustable inductive tuning stub to tune-out the capacitive susceptance of the tunnel diode presented at the junction.

The invention will be described by referring to the accompanying drawings wherein.

Figures 1, 2, 3, 4:
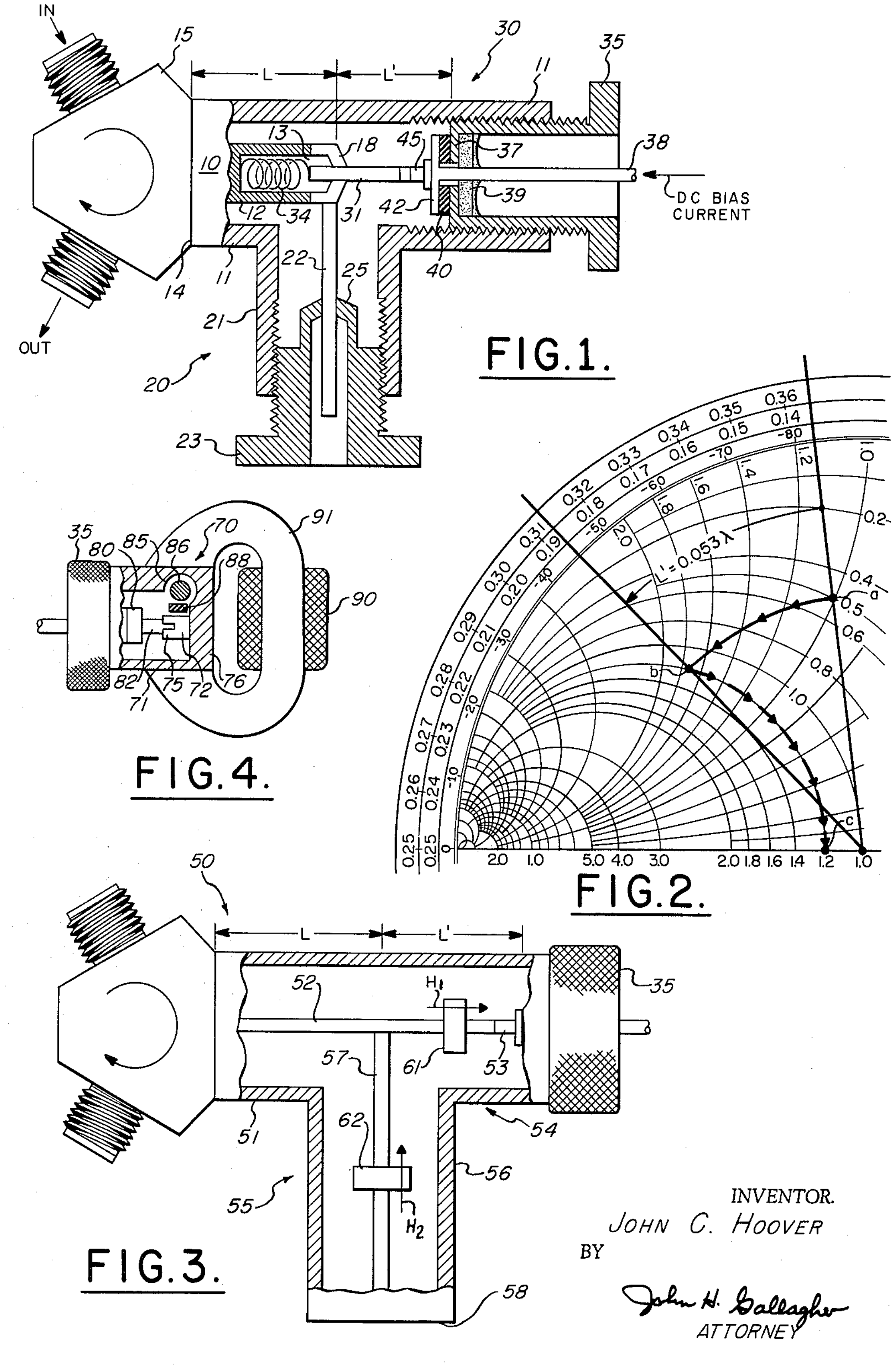
FIG. 1 is a simplified representation of a sectional view of the adjustable gain amplifier of this invention.
FIG. 2 is a portion of a Smith chart used in explaining the operation of the amplifier of this invention.
FIGS. 3 and 4 are simplified illustrations of other embodiments of this invention.

Referring now in detail to FIG. 1 of the drawings, the single port adjustable gain tunnel diode amplifier of this invention is comprised of a section of coaxial transmission line 10 having an outer tubular conductor 11 and an inner conductor 12 that has a hollow portion 13 at its right end. The left end 14 of coaxial transmission line 10 is open and is adapted to propagate electromagnetic waves into and out of the line. A Y-junction circulator 15 of known design may be coupled to end 14 for separating the input and output waves of coaxial line section 10. Inner conductor 12 is terminated at its right end by spring contact fingers 18 so that line 10 has an effective length L.

Coupled to the right end of coaxial line section 10, and extending transversely therefrom is a coaxial line adjustable tuning stub 20 comprised of outer conductor 21, inner conductor 22, and a threaded shorting member 23. Shorting member 23 is of a conductive material and threadably engages the internally threaded surface of outer conductor 21, and conductively engages inner conductor 22 by means of spring contact fingers 25, thereby providing an adjustable short circuit between outer conductor 21 and inner conductor 22.

A second coaxial line tuning stub 30 extends axially beyond the end of coaxial line section 10 and has an outer conductor 11 common to the outer conductor of coaxial line section 10. The inner conductor 31 of stub 30 extends through the right end of inner conductor 12 and is in sliding contact with spring fingers 18, thereby maintaining conductive continuity between inner conductors 12 and 31. A helical spring 34 is housed within the hollow portion 13 of inner conductor 12 and exerts a force against the end of inner conductor 31. The right end of tuning stub 30 is comprised of a cup-shaped gain adjusting member 35 that is threaded along its cylindrical surface to engage the threaded inner surface of outer conductor 11. Gain adjusting member 35 is of a conductive material and its bottom portion 37 is apertured to permit the conductive pin 38 to pass therethrough without making contact. An annular disc resistor 39 is positioned coaxially within gain adjusting member 35, and an annular disc of dielectric material 40 is positioned in contact with the left face of the bottom portion 37 of gain adjusting member 35. The conductive pin 38 extends coaxially through both the resistor 39 and the dielectric disc 40 and terminates at its left end in a disc-shaped portion 42. Disc-shaped portion 42, dielectric disc 40 and the adjacent bottom portion 37 of gain adjusting member 35 form an R.F. by-pass capacitor to electromagnetic waves in the frequency range to be amplified. A tunnel diode 45 is held securely between the right end of inner conductor 31 and the disc-shaped portion 42 of conductive pin 38. As an example, tunnel diode 45 may be the type MS232, manufactured by Micro State Electronics Corporation, Murray Hill, New Jersey. The members just described that form the structure at the right end of tuning stub 30 are secured together and are axially movable together when the gain adjustment member 35 is rotated. Upon rotation of gain adjustment member 35, inner conductor 31 slides through the spring contact fingers 18 so as to vary the effective length L′ of tuning stub 30. Helical spring 34 exerts a force against the end of inner conductor 31 so as to avoid any backlash or loose contact between the threads of gain adjustment member 35 and the inner surface of outer conductor 11.

A D.C. diode biasing current is coupled through conductive pin 38 to tunnel diode 45, and the D.C. current path is completed to ground through inner conductor 31, spring contact fingers 18, inner conductor 22 of tuning stub 20, and thence to the outer grounded conductor 21 of stub 20. The disc resistor 39, having a larger positive conductance than the maximum negative conductance of the tunnel diode, assures that the D.C. bias circuitry sees a net positive conductance at all frequencies. This assures a stable D.C. bias to tunnel diode 45 for all operating conditions of the amplifier.

In designing and constructing the gain adjusting tuning stub 30, the objective is to make the termination of this stub appear, within the operating frequency range of the amplifier, as only the admittance of tunnel diode 45. This termination should be as free as possible of spurious admittance and this is accomplished by assuring that the R.F. by-pass capacitor described above represents an effective short circuit to electromagnetic waves within the operating frequency range of the amplifier. Stray reactances in the termination of stub 30, and particularly stray inductive reactances, can lead to instabilities in the operation of the amplifier. The compact assembly of the R.F. by-pass capacitor and disc resistor 39 minimizes the inductive reactances and gives assurance of stable operation of the amplifier.

As mentioned previously, the voltage gain $g$ of the tunnel diode amplifier is equal to the voltage reflection coefficient K, and as seen from Equation 1, K in turn is a function of the terminating admittance $Y_t$, which in the device in FIG. 1 is the negative conductance of tunnel diode 45. Therefore, within a given range of values, a value of gain $g$ may be selected and the value of terminating admittance $Y_t$ may be determined to satisfy Equation 1 for the selected value of gain. This value of terminating admittance $Y_t$ is the value as seen at the open end 14 of coaxial line section 10. This calculated value of terminating admittance then may be transformed by the use of a transmission line chart, such as a Smith chart, a distance L to the other end of coaxial line section 10, that is, at the junction of tunable stubs 20 and 30 with coaxial line section 10. Gain adjustment knob 35 then is rotated to vary the axial position of tunnel diode 45 relative to the junction and thus vary the length L′ of the gain adjustment tuning stub 30. By this means the negative conductance presented by tunnel diode 45 is transformed to present the desired value at the junction of the stubs 20 and 30 with coaxial line section 10. The admittance presented by tunnel diode 45 will have a capacitive susceptance associated therewith, as is well known. This capacitive susceptance is tuned out by adjusting the length of tuning stub 20 so as to leave a substantially pure negative conductance as the effective terminating admittance of coaxial line section 10.

An illustrative example of the use of the Smith transmission line chart to determine the gain adjustment required to produce a given value of gain now will be demonstrated. In order to use the Smith chart with the negative values of conductance with which we are concerned, the following alterations must be made to the usual procedure involved in the use of a Smith chart. The negative conductance will be plotted as a positive value and the capacitance as an inductance. Also, the usual direction of rotation on the chart must be reversed. With these changes in mind, and for the sake of an example, assuming that the terminating admittance $Y_t$ should have a value of $-1.2$ at the junction in order to obtain the desired gain, and assuming that the normalized admittance $Y_d$ of the tunnel diode is equal to $-0.5+j1.0$, the procedure is as follows:

The admittance $Y_d$ of the diode is plotted at point $a$ on the chart of FIG. 2. The plot is then rotated in the counterclockwise direction along an arc of constant radius to the point $b$ on the conductance line 1.2, this rotation representing an electrical length L′ of $.053\lambda$. Tuning stub 20 then would be adjusted to provide a value of positive susceptance to cancel the negative susceptance of the diode. This is represented on the chart by swinging the plot to the point $c$ that represents the pure negative conductance equal to the desired normalized value $-1.2$.

It thus may be seen that with the addition of the adjustable gain tuning stub 30, the value of negative conductance $Y_d$ presented by tunnel diode 45 may be transformed to a value required at the end of coaxial line section 10 to produce the desired voltage gain. The only mechanical adjustment required is the rotation of gain adjustment member 35 of tuning stub 30 and threaded tuning member 23 of tuning stub 20, and these adjustments may be readily performed at any time by relatively unskilled personnel. Having now provided simple means for adjusting the gain of the tunnel diode amplifier, there is substantially no limitation on the characteristics of the tunnel diode employed, and the necessity of the prior practice of altering the structure or selecting a particular diode from a great number may be completely dispensed with.

It is apparent from the above description that the gain adjustment was achieved by varying the electrical separation of tunnel diode 45 from the input end 14 of coaxial transmission line 10. The electrical length of stub 30 was varied, and with it the position of tunnel diode 45, by means of the threaded gain adjusting member 35 that is in threaded engagement with the outer conductor 11, and by means of the sliding contact between the center conductors 12 and 13. Other means may be provided for varying the separation of the tunnel diode from the input end, or some other reference point, of the transmission line. For example, ferrimagnetic materials may be inserted within the transmission line to function as variable phase shifters. An arrangement of this type is illustrated in the simplified sketch of FIG. 3, wherein a section of coaxially transmission line 50 is comprised of outer conductor 51 and a coaxially disposed inner conductor 52. A tunnel diode 53 is positioned adjacent the right end of coaxial line 50, this right end of the line forming the stub 54, and this right end of the line is terminated in substantially the same manner as the line illustrated in FIG. 1. An inductive coaxial tuning stub 55 comprised of an outer conductor 56 and an inner conductor 57 extends transversely from coaxial line section 50, and is terminated by a reflecting short circuit 58. Disposed within the stubs 54 and 55 are discs of ferrimagnetic materials 61 and 62, respectively. Both of said ferrimagnetic discs 61 and 62 are magnetized in a direction parallel to their respective stubs by means of magnetic biasing fields $H_1$ and $H_2$. These magnetized ferrimagnetic discs function as variable phase shifters in the manner well understood in the art to vary the lengths of the respective stubs as a function of their permeabilities, which in turn is a function of the strength of their magnetic biasing fields. The operation of the adjustable gain amplifier illustrated in FIG. 3 would be similar to that described in connection with the amplifier of FIG. 1, except that the gain would be adjusted by controlling the strengths of the biasing magnetic fields rather than physically adjusting the length of the stubs.

Other alternatives for varying the lengths of the two tuning stubs also may be employed to produce an adjustable gain tunnel diode amplifier. For example, varactor diodes might be placed in series in the center conductor of each of the stubs. In this instance, the gain and frequency tuning of the amplifier would be accomplished electronically by varying the biasing current to each of the varactor diodes.

Another alternative embodiment would be a mechanical arrangement somewhat like the embodiment illustrated in FIG. 1. This embodiment would have a fixed termination in place of the adjustable termination for stub 30 of FIG. 1, and both the outer conductor 11 and inner conductor 12 of the device of FIG. 1 would have sliding joints at regions between the input end 14 and the junction of stubs 20 and 30 with the end of coaxial line section 10. In this type of arrangement both stubs would be axially translatable by means of the sliding joints, and the stub 20 still would be tunable to match out the capacitive susceptance of the tunnel diode.

In considering the structures of FIGS. 1 and 3 with a slightly different point of view, the adjustable gain tuning stubs 30 and 54, respectively, might be considered as part of the main transmission lines 10 and 50, respectively, and serve as adjustable terminating means for the main transmission lines. Therefore, in accordance with this different view, the devices of FIGS. 1 and 3 may be considered as a main transmission line having an adjustable negative conductance termination, and having associated therewith an adjustable parallel inductive tuning stub coupled thereto. The other way of considering the structures is to consider them as comprised of a section of transmission line having two parallel stubs coupled to its end, one stub being the adjustable inductive tuning stub and the other the adjustable gain tuning stub for adjusting the value of negative conductance to be reflected to the junction where the stubs couple to the end of the transmission line.

Another embodiment of the present invention is illustrated in FIG. 4 wherein a section of coaxial transmission line 70 is comprised of an outer conductor 71 and an inner conductor 72 which is terminated at its left end by spring contact fingers 75. The right end of the coaxial line 70 is terminated in a conductive wall 76. The left end of the line 70 is terminated by the tunnel diode 80 and by a R.F. by-pass capacitor (not illustrated) in the same manner as illustrated in FIG. 1. The position of tunnel diode 80 with respect to the end of inner conductor 72 is varied by the threaded gain adjustment member 35 which causes the inner conductor 82 to slide through spring contact fingers 75. As in FIG. 1, this provides the means for varying the magnitude of the negative conductance presented at a reference plane through the end of inner conductor 72.

Electromagnetic waves are coupled into coaxial line section 70 through a transversely-extending coaxial transmission line comprised of outer conductor 85 and inner conductor 86. Coupling between the two transmission lines is accomplished through the ferrimagnetic disc 88 which functions as a resonator. Ferrimagnetic disc 88 may be a single crystal yttrium-iron garnet (YIG) disc, or sphere. The operation of these YIG elements as resonators is well known in the art. The ferrimagnetic disc 88 is magnetically biased by an electromagnet comprised of magnetizing coil 90 and iron yoke 91. As employed in this embodiment of the invention, the ferrimagnetic disc 88 is operated slightly off its resonant frequency so as to provide an inductance that is coupled to the transmission line 70 and which tunes out the capacitive susceptance of tunnel diode 82. The characteristics of the ferrimagnetic disc 88 may be properly proportioned to function as a resonator in the desired frequency range by selecting the proper constituent materials and additives, and by the selection of the proper geometry. As is evident from the illustration of FIG. 4, this embodiment of the invention also is electrically tunable in its frequency of operation by varying the magnetic field applied to ferrimagnetic disc 88 as well as being tunable in gain by means of the gain adjustment member 35.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An adjustable gain amplifier employing a negative conductance device comprising,
   - a section of transmission line adapted to receive at one end thereof electromagnetic waves within a given frequency range,
   - means disposed at the other end of the line for providing a negative conductance to electromagnetic waves propagating on said line,
   - means for varying the electrical length of said transmission line to vary the electrical separation of the negative conductance means from said one end of the transmission line, and
   - variable admittance means coupled to said transmission line for presenting at a reference point on said line a value of admittance proportioned to substantially cancel any susceptance presented by said negative conductance means at said reference point on said transmission line.

2. An adjustable gain amplifier employing a negative conductance device comprising,
   - a section of transmission line adapted to receive at one end thereof electromagnetic waves within a given frequency range,
   - first and second adjustable tuning stubs each coupled to the opposite end of said tranmission line in a manner to form a common junction,
   - means associated with the first one of said stubs for terminating that stub with an admittance having a negative conductance component,
   - means for varying the electrical separation between said junction and the terminating admittance of said first stub, and
   - means associated with the second one of said tuning stubs to present at said junction a value of susceptance proportioned to cancel the susceptance presented at said junction by the terminating admittance of said first stub.

3. The combination claimed in claim 2 wherein,
   - the means for providing the terminating admittance of said first stub includes an R.F. by-pass capacitor that presents substantially a short circuit to said electromagnetic waves in said given frequency range, and further includes a semiconductor device in wave coupling relationship with waves in said stub and exhibiting a negative conductance characteristic to electromagnetic waves within said given frequency range.

4. The combination claimed in claim 2 wherein said means for varying the electrical separation between said junction and the terminating admittance of said first stub includes,
   - means positioned intermediate said junction and said terminating admittance for varying the physical length of the stub, thereby to vary the physical and electrical separation of said terminating admittance from said junction.

5. The combination claimed in claim 2 wherein the means for varying electrical separation between said junction and the terminating admittance of said first stub includes, material exhibiting ferrimagnetic properties to said electromagnetic waves and adapted to present different values of permeability to said waves when magnetized by a biasing magnetic field of variable strength.

6. An adjustable gain amplifier employing a negative conductance device comprising, a section of TEM mode transmission line having at least first and second conductors and adapted to receive electromagnetic waves at an input end thereof, means adjacent the other end of said line for providing an effective short circuit to electromagnetic waves, means disposed between one of said conductors and said short circuiting means for providing a negative conductance to electromagnetic waves propagating on said line, means for varying the electrical length of said transmission line to vary the electrical separation of the negative conductance means from the input end of said transmission line, and, variable admittance means coupled to said transmission line and adapted to present a value of admittance proportioned to substantially cancel any susceptance present by said negative conductance means at a given position of said transmission line.

7. An adjustable gain amplifier employing a negative conductance device comprising, a section of coaxial transmission line having an inner and an outer conductor and adapted to receive electromagnetic waves at one end thereof, first and second coaxial line stubs coupled to said transmission line at a common junction at the other end thereof, reflective short circuiting means terminating one of said stubs, said short circuiting means being variable in position for presenting a required value of admittance at said junction, negative conductance means terminating the other one of said stubs and operative in response to electromagnetic waves at a given frequency to provide amplification of said waves, and means for varying the electrical distance between said negative conductance means and said junction.

8. An adjustable gain amplifier employing a negative conductance device comprising, a section of coaxial transmission line having an inner and an outer conductor and adapted to receive electromagnetic waves at one end thereof, first and second coaxial line stubs coupled to said transmission line in a common junction at the other end thereof, reflective short circuiting means terminating one of said stubs, said short circuiting means being variable in position for presenting a given value of admittance at said junction, negative conductance means terminating the other one of said stubs and operative in response to electromagnetic waves at a given frequency to provide amplification of said waves, and means for varying the electrical distance between said negative conductance means and said one end of the transmission line, whereby the values of negative conductance, and thus the gain, at the input end of said transmission line is varied by positioning said negative conductance.

9. A variable gain amplifier employing a negative conductance device comprising, a section of TEM mode transmission line having an inner and an outer conductor and adapted to receive electromagnetic waves at one end thereof, means adjacent the other end of said line for providing an effective short circuit to electromagnetic waves propagating between said conductors, means interposed between said short circuiting means and said inner conductor for presenting a negative conductance to electromagnetic waves propagating on said line, variable admittance means coupled to said transmission line at a region between its two ends, and means for varying the electrical separation of said short circuiting means and said negative conductance means relative to said variable admittance means, thereby to provide means for varying the value of the conductive reactance of said negative reactance means as transformed to the input of said transmission line.

10. An adjustable gain negative conductance amplifier comprising, a section of TEM mode transmission line having an outer conductor and an inner conductor, one end of said transmission line being adapted to propagate into and out of said transmission line electromagnetic waves within a given frequency range, a transversely-extending tuning stub coupled to the opposite end of said transmission line, said tuning stub having an outer conductor in contact with the outer conductor of said transmission line and an inner conductor in electrical contact with the inner conductor of said transmission line, a second tuning stub axially aligned with said transmission line and having an outer conductor in electrical contact with the outer conductor of said transmission line and having an inner conductor in movable electrical contact with the inner conductor of said transmission line, means for terminating said second tuning stub with a terminating admittance having a negative conductance component, and means for moving the position of said terminating means relative to said opposite end of the transmission line, thereby providing means for varying the magnitude of the negative conductance component as transformed to said opposite end of the transmission line.

11. The combination claimed in claim 10 wherein said means for terminating said second stub with a terminating admittance having a negative comductance component includes, means for presenting substantially a short circuit to electromagnetic waves within said given frequency range and a semiconductor device characterized by having a negative conductance to electromagnetic waves within said given frequency range.

12. An adjustable gain negative conductance amplifier comprising, a section of coaxial transmission line having an outer conductor and an inner conductor, one end of said transmission line being adapted to propagate electromagnetic waves into and out of said transmission line, said inner conductor terminating intermediate the ends of said outer conductor and having a recessed portion at its terminated end, a transversely-extending tuning stub coupled to said coaxial line section intermediate its two ends, said tuning stub having an outer conductor in contact with the outer conductor of said transmission line and an inner conductor contacting the terminated end of the inner conductor of said transmission line, a second tuning stub axially aligned with said coaxial transmission line and having an outer conductor in electrical continuity with the outer conductor of said transmission line and having an inner conductor in movable electrical contact with the recessed portion of inner conductor of said transmission line, means providing an axially movable negative conductance termination for said second tuning stub, the inner conductor of said second tuning stub being axially movable with said last-named means to make a moving contact with the recessed portion of the inner conductor of said transmission line, whereby the value of negative conductance presented at the region of said transmission line where its inner conductor is terminated may be varied by varying the axial position of said negative conductance means.

13. A tunable electromagnetic amplifier employing a negative conductance device comprising, a section of electromagnetic wave transmission line adapted to receive at one end thereof electromagnetic waves within a given frequency range, means disposed at the other end of the line for providing a negative conductance to electromagnetic waves progagating on said line, and means for varying the electrical separation of said negative conductance means from said one end of the transmission line thereby providing means for varying the magnitude of negative conductance presented at a reference plane in said transmission line.

References Cited by the Examiner

UNITED STATES PATENTS 3,112,454 11/1963 Steinhoff.

ROY LAKE, *Primary Examiner.*

NATHAN KAUFMAN, *Examiner.*